United States Patent [19]
Leman

[11] Patent Number: 6,075,693
[45] Date of Patent: Jun. 13, 2000

[54] COMPUTER SYSTEM SECURING APPARATUS AND METHOD WITH CONCEALED SECURITY TAB

[75] Inventor: Michael Leman, Eagle, Id.

[73] Assignee: Micron Electronics, Inc., Nampa, Id.

[21] Appl. No.: 09/177,701

[22] Filed: Oct. 22, 1998

[51] Int. Cl.[7] .................................................. H05K 5/00
[52] U.S. Cl. .............................. 361/683; 292/87; 292/88; 292/89; 292/284; 292/286; 361/681; 361/683; 70/58
[58] Field of Search ..................................... 361/681, 683; 70/58, 59; 292/87, 88, 89, 284, 286

[56]                References Cited
                U.S. PATENT DOCUMENTS

| | | | |
|---|---|---|---|
| 4,738,428 | 4/1988 | Themistos et al. | 248/551 |
| 5,154,456 | 10/1992 | Moore et al. | 292/162 |
| 5,228,319 | 7/1993 | Holley et al. | 70/58 |
| 5,361,610 | 11/1994 | Sanders | 70/14 |
| 5,397,176 | 3/1995 | Allen et al. | 312/223.2 |
| 5,406,809 | 4/1995 | Igelmund | 70/2 |
| 5,446,618 | 8/1995 | Tetsuya et al. | 361/683 |
| 5,495,389 | 2/1996 | Dewitt et al. | 361/683 |
| 5,526,226 | 6/1996 | Katoh et al. | 361/680 |
| 5,660,065 | 8/1997 | Edlund | 70/58 |
| 5,732,000 | 3/1998 | Chiesi et al. | 364/708.1 |
| 5,787,737 | 8/1998 | Cho | 70/58 |

*Primary Examiner*—Leo P. Picard
*Assistant Examiner*—Tung Minh Bui
*Attorney, Agent, or Firm*—Paul A. Revis

[57]                ABSTRACT

The present invention provides for an apparatus and method for securing a computer system. A security loop or tab is attached to a computer chassis and used to engage a cover that encloses at least a portion of a side of the computer chassis. Structure is provided in embodiments of the invention to releasably engage the cover with the security tab and to provide a means of locking the cover on the chassis to prevent unauthorized access to the computer system. Additionally, the securing apparatus is place in a location not readily visible to users of the computer system.

21 Claims, 7 Drawing Sheets

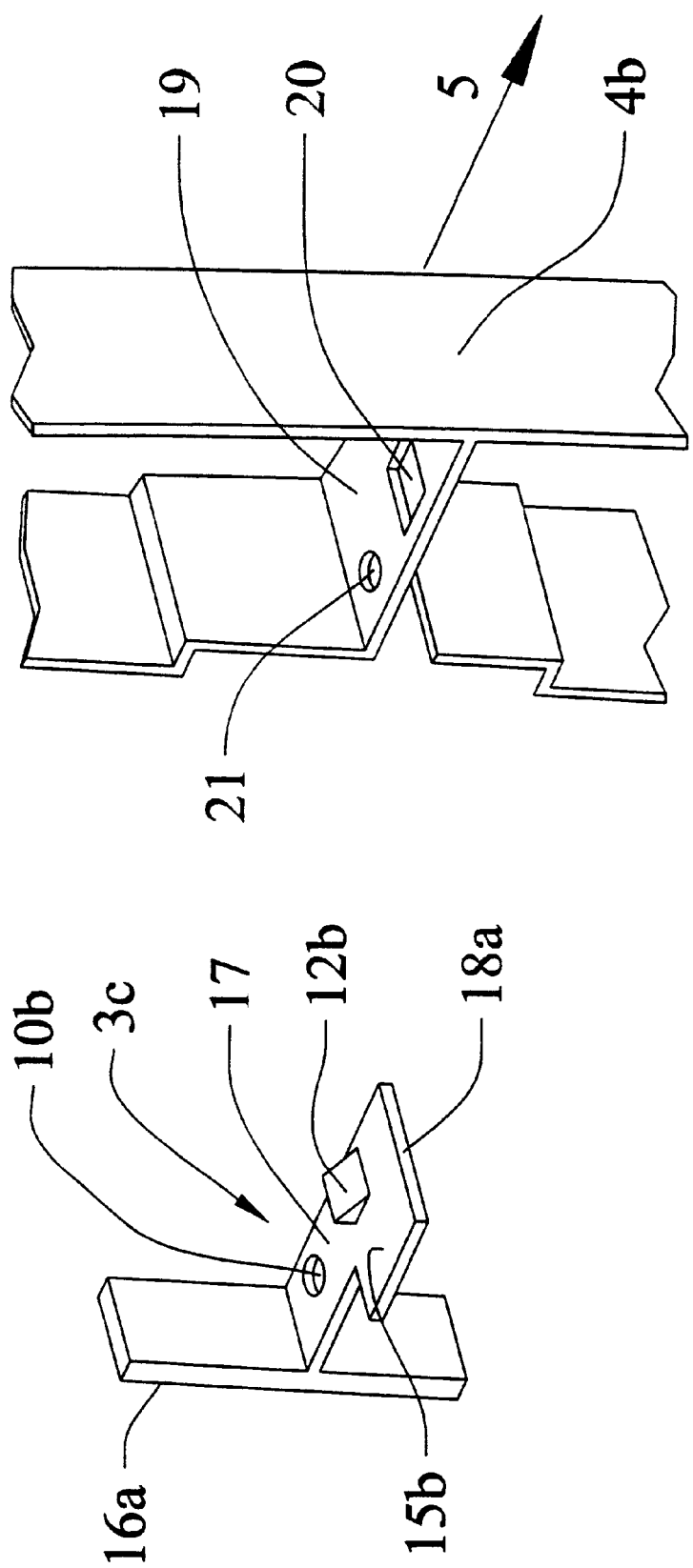

COMPUTER SYSTEM SECURING APPARATUS AND METHOD WITH CONCEALED SECURITY TAB

TECHNICAL FIELD

The present invention is directed toward an apparatus and method for providing a concealed and releasable security mechanism for a case of a computer system.

BACKGROUND OF THE INVENTION

Theft as well as unauthorized access to computer components are concerns that have arisen for owners of computer systems. Another concern is easy access to the components of a computer system for the purpose of maintenance. Computer system manufacturers have responded to the concerns of purchasers by providing security mechanisms and easy access computer cases. However, security mechanisms and easy access mechanisms often work at cross purposes against one another.

One popular form of security mechanism is a means for attaching a cable to a portion of a computer system. The use of a cable is advantageous because the computer system is not rigidly fixed to any other object. Therefore, a user can move the system within the range of the cable without consulting security authorities. Additionally, some maintenance functions can be performed on the system without disengaging the cable. Because of the advantages of using a cable, many devices have been designed for securely attaching a cable to a computer system. A disadvantage of many of these devices is that they are unsightly. Not only are the devices unsightly, but they are also placed in locations on a system where they are visible.

Easy access computer cases have become very common in recent years. One of the primary goals of an easy access case is to be able to fasten a cover on the case without the use of screws. Therefore, no screwdriver or other tool is required to open many easy access cases. With a typical easy access case, the cover is released merely by pushing a button or turning a knob.

An improved device would combine the security advantages of an efficient attachment device for a cable or other locking mechanism with the convenience of an easy access case. Furthermore, an improved device should conceal the attachment device from the view of a user. Not only would concealment improve the aesthetics of the computer system, but it would also surprise an unsuspecting thief and increase the chances of apprehending the thief. Additionally, an easy access case should be capable of being opened without the use of tools such as screwdrivers or wrenches.

SUMMARY OF THE INVENTION

An embodiment of the invention is a computer system securing apparatus that includes a computer chassis, a security tab extending from the computer chassis along a first direction, and a cover. The cover encloses a side of said computer chassis. The cover is detachable from the computer chassis by movement in the first direction. The cover has an opening through which the security tab extends. In some embodiments of the invention, the security tab extends substantially perpendicular from the chassis in the first direction.

In a number of embodiments of the invention, the security tab includes a locking hook for detachably engaging the cover. The security tab may also include a release surface for pushing to disengage the security tab from the cover.

In some embodiments of the invention, the security tab is located in a location not visible from the front of the computer system.

Additionally, embodiments of the invention include a power supply, central processing unit, and a memory module coupled to the securing apparatus.

Embodiments of the invention also include a computer system securing apparatus comprising a computer chassis, a means for engaging a cover with the computer chassis, and a means for disengaging the cover from the computer chassis.

Still another embodiment of the invention is a method of securing a computer system comprising the acts of placing a cover for at least a portion of a compute chassis adjacent to a side of the computer chassis so that an opening in the cover aligns with a security tab, and moving the cover toward the security tab so that the security tab enters into the opening to engage the security tab in the opening.

BRIEF DESCRIPTION OF THE DRAWINGS

FIG. 4A is a perspective view of the security tab shown in FIG. 4.

FIG. 4B is a perspective view or a portion of the computer system cover shown in FIG. 4.

DETAILED DESCRIPTION OF THE INVENTION

Figure 1:
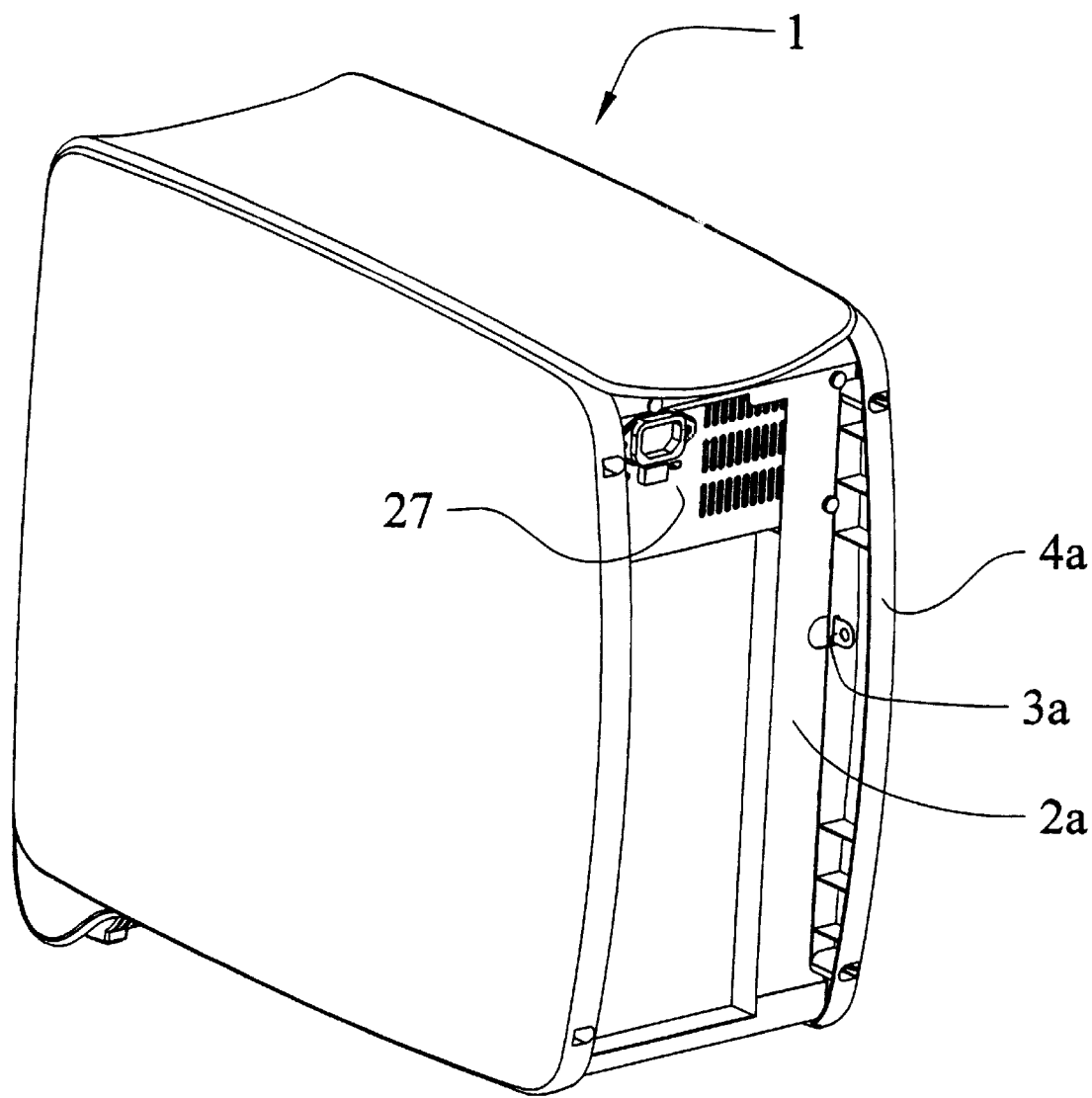
FIG. 1 is a perspective view of the back of a computer system with a concealed security tab.

Embodiments of the present invention are directed toward a computer system securing apparatus that includes a computer chassis, a security tab, and a cover. FIG. 1 illustrates the general configuration of an embodiment of the invention. In FIG. 1, a computer system 1 is shown. A portion of a chassis 2a is shown supporting other elements of the computer system 1. A security tab 3a extends from the chassis 2a. A back edge of a cover 4a is also illustrated. The majority of the cover 4a is not visible in FIG. 1.

DESCRIPTION OF AN EMBODIMENT OF THE SECURING APPARATUS

Figure 2:
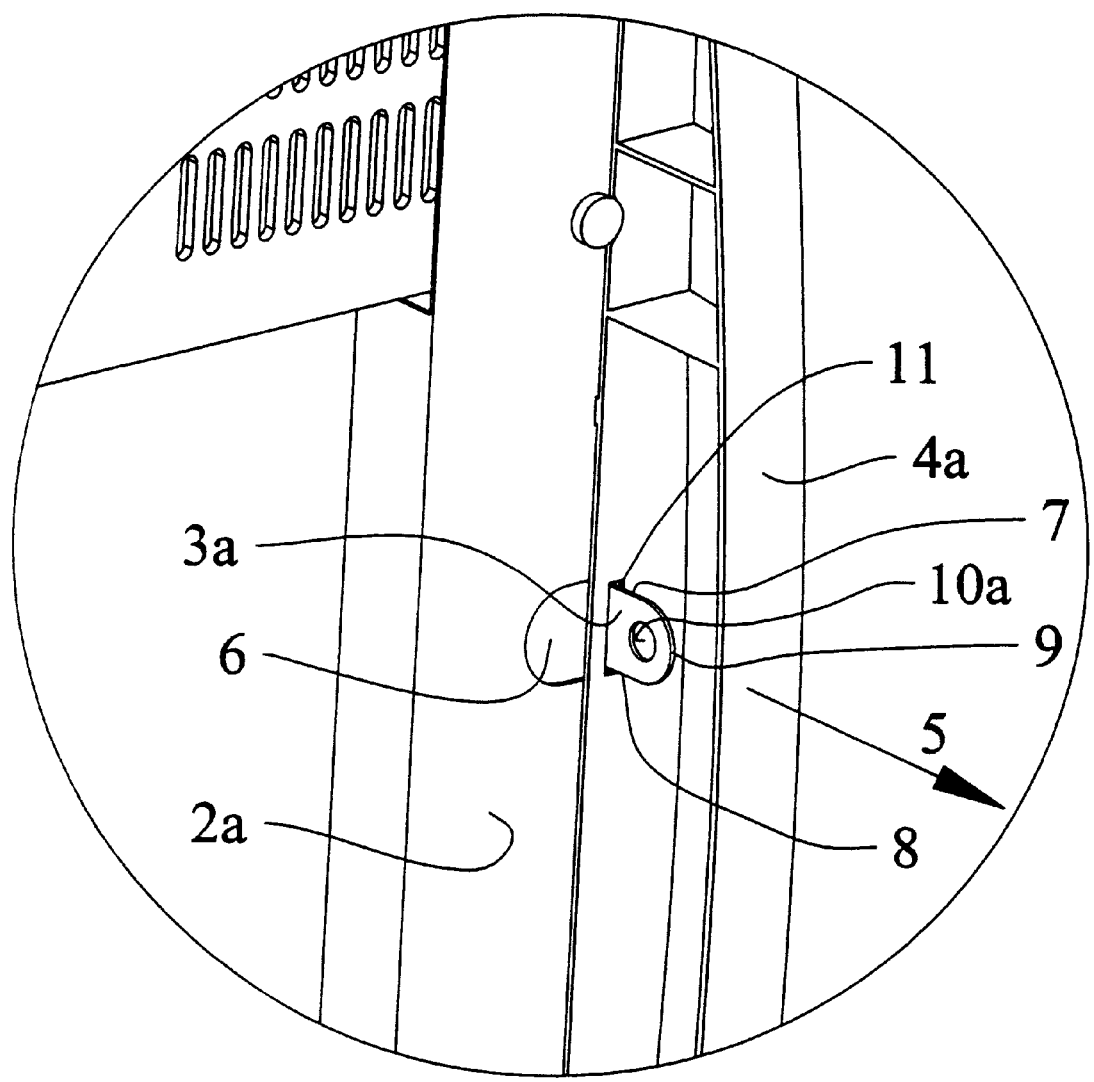
FIG. 2 is an enlarged perspective view of the concealed security tab illustrated in FIG. 1.

FIG. 2 shows an enlarged view of the chassis 2a, the security tab 3a, and the cover 4a at the point of engagement of the components.

Chassis

The computer system 1 and the chassis 2a shown in FIGS. 1 and 2 illustrate a "mini-tower" system. Other computer system configurations are within the scope of the invention as well. For example, the computer system could be a desktop system, server system, tower system, or any number of other computer system configurations.

The chassis may be constructed from a plurality of metal parts manufactured from sheet metal. The portion of the chassis 2a shown is a sheet metal component. Other materials, plastic for example, would serve equally well as structural elements in the manufacture of the chassis 2a.

Security Tab

As illustrated in FIG. 2, the security tab 3a extends substantially perpendicular from the chassis 2a in a first direction 5. The security tab 3a can be formed by cutting and bending material from an area 6 of the chassis 2a. In other embodiments, a security tab could be molded or milled or formed by some other technique rather than cut and bent into place. The resulting security tab 3a has a first edge 7, a second edge 8, and a radial edge 9. The second edge 8 is on the opposite side of the security tab 3a from the first edge 7, and the second edge 8 is substantially parallel with the first edge 7. The radial edge 9 extends between the first edge 7 and the second edge 8. A hole 10a is provided in the security tab 3a for accepting a locking member (not shown). A locking member may be a cable, a pad lock, a combination lock, a pin, or any other such object that could be placed in the hole 10a to prevent the cover 4a from being removed from engagement with the security tab 3.

Cover

The cover 4a shown in FIGS. 1 and 2 is a side access panel cover. In other embodiments of the invention, the cover may be the top, bottom, front, back, or other side panel. The cover 4a encloses at least a portion of a side of the computer chassis 2a. The cover 4a is detachable from the chassis 2a by movement of the cover 4a in the first direction 5. The cover 4a has an opening 11 through which the security tab 3a extends. By removing the cover 4a from the chassis 2a, components within the computer system are made accessible.

DESCRIPTION OF ANOTHER EMBODIMENT OF THE SECURING APPARATUS

Figure 3:
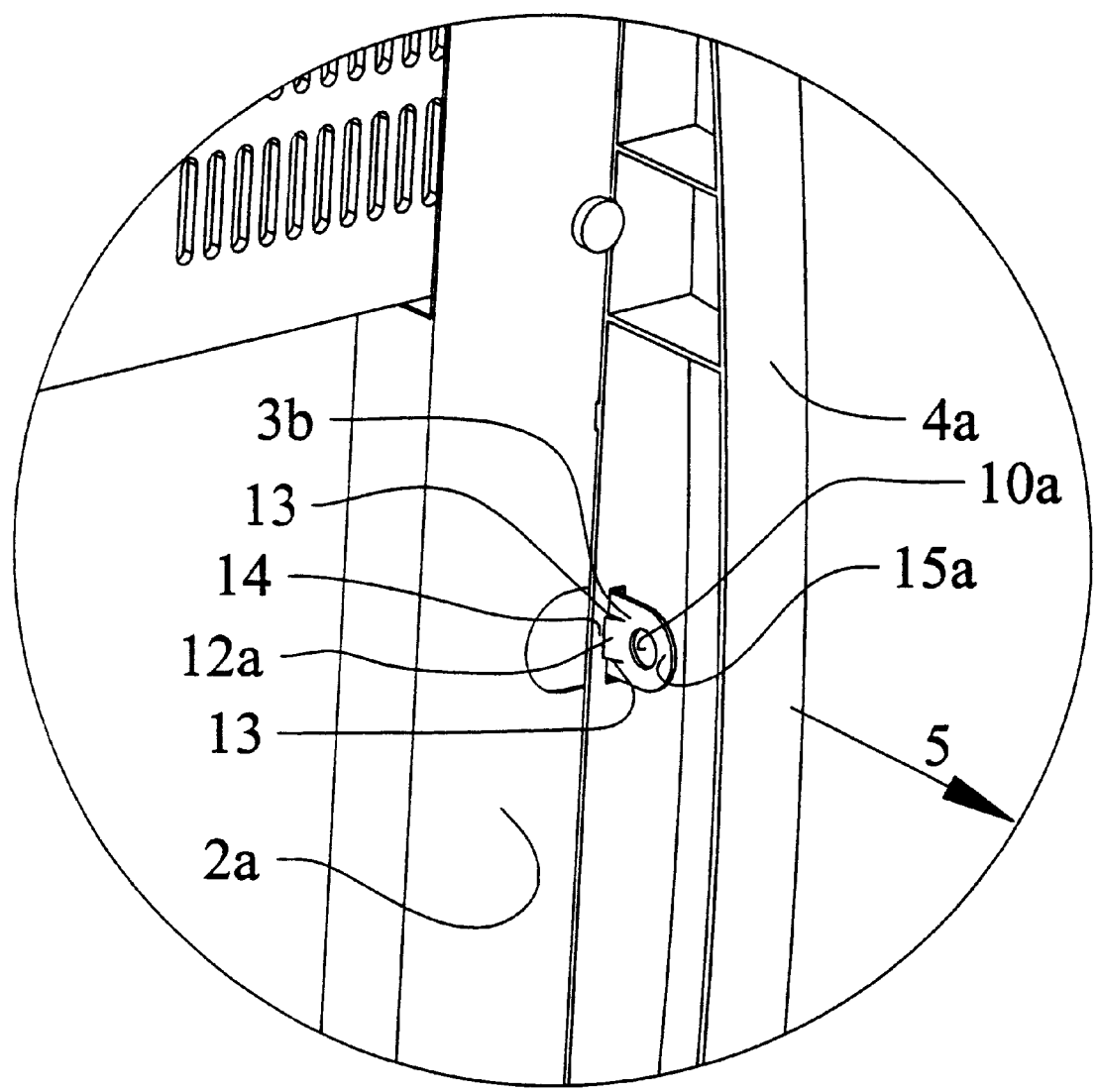
FIG. 3 is an enlarged perspective view of another embodiment of the concealed security tab engaged with a computer system cover.

Another embodiment of the invention is shown in FIG. 3. The chassis 2a and the cover 4a are substantially identical to the chassis and cover of the embodiment of the invention described immediately above.

Security Tab

A security tab 3b is shown in FIG. 3. The security tab 3b is similar to the security tab 3a described above. In addition to the features of the security tab 3a, security tab 3b has a locking hook 12a. In the embodiment shown, the locking hook 12a is formed from a portion of the material of the security tab 3b. The locking hook 12a may be formed by making cuts 13 in the security tab 3b and deforming the locking hook 12a beyond the plane of the security tab 3b. The locking hook 12a then enables the security tab to detachably engage the cover 4a at surface 14 of cover 4a. The security tab 3b may also include a release surface 15a. By pushing the release surface 15a in a direction substantially perpendicular to the first direction 5, the locking hook 12a of the security tab 3b is disengaged from the surface 14 of the cover 4a and the cover 4a is permitted to move in the first direction 5.

DESCRIPTION OF ANOTHER EMBODIMENT OF THE SECURING APPARATUS

Figure 4:
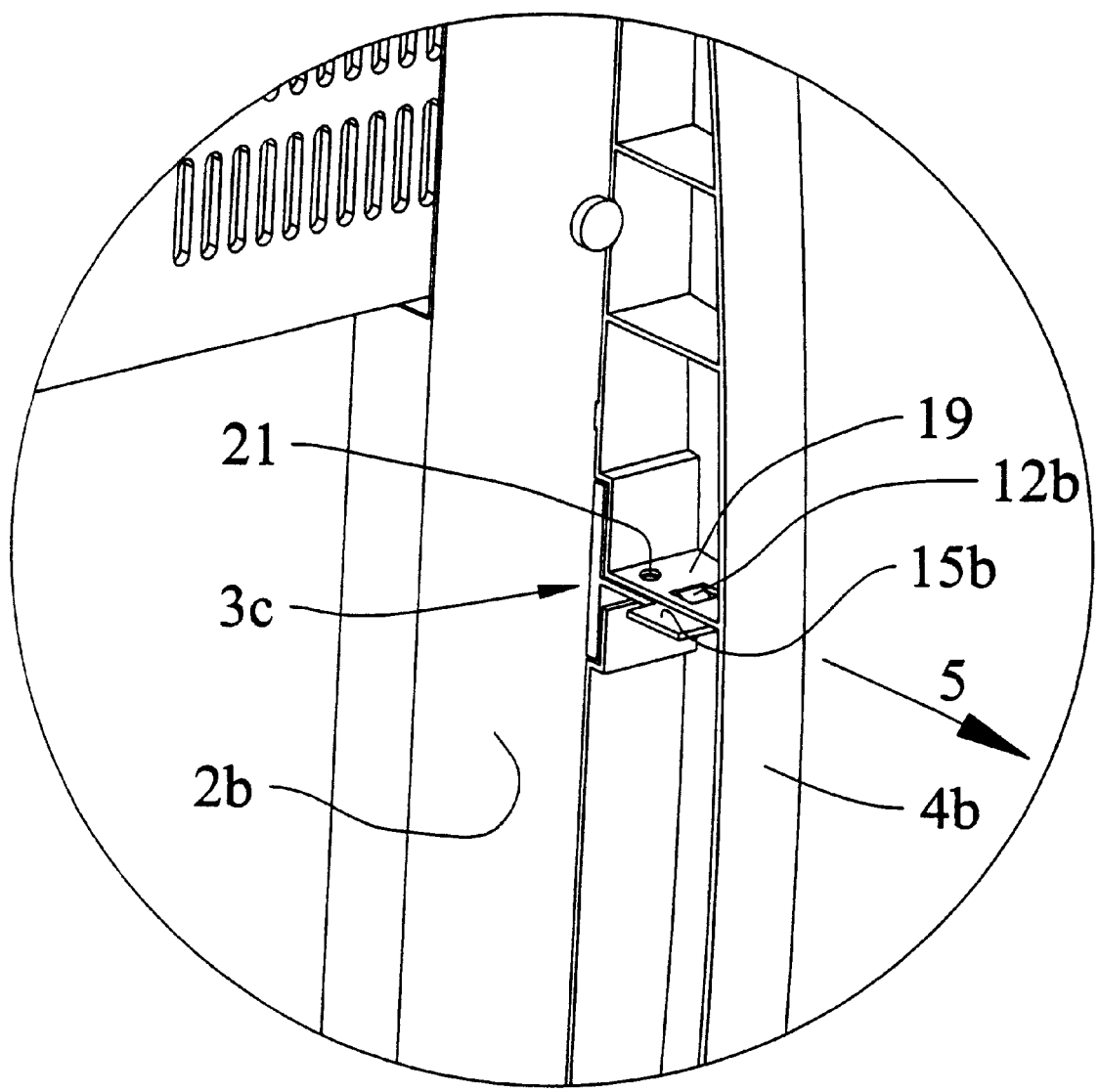
FIG. 4 is an enlarged perspective view of another embodiment of the concealed security tab engaged with a computer system cover.

Another embodiment of the invention is shown in FIG. 4. The chassis 2b is very similar to the chassis 2a of the embodiments detailed above. The chassis 2b does not have a portion removed to form a security tab in the embodiment illustrated.

Security Tab

The security tab 3c is illustrated in FIGS. 4 and 4A. The security tab 3c has a base 16a. The base 16a may be fastened to the chassis 2b by any conventional means, or the base 16a and the security tab 3c may be formed from the same material as the chassis 2b. As shown in FIG. 4A, a first surface 17 of an appendage 18a is substantially perpendicular to the base 16a. The appendage 18a is coupled to the base 16a by any means and may also be manufactured as a unit with the base 16a. A locking hook 12b extends from the first surface 17. The locking hook 12b may be a wedge-shaped extension from the first surface 17. The locking hook 12b is for detachably engaging a cover 4b. The security tab 3c has a release surface 15b that is coplanar with the first surface 17. The release surface 15b is for pushing to disengage the security tab 3c from the cover 4b. The security tab 3c may have a hole 10b through the appendage 18a and the first surface 17.

Cover

FIG. 4 shows the cover 4b engaged with the security tab 3c. As shown in FIGS. 4 and 4B, the cover 4b has a member 19 that is substantially parallel with the first surface 17. The member 19 has an indention 20 for engaging the locking hook 12b. In the embodiment illustrated, the indention is a rectangular hole through the member 19. The indention 20 does not have to be a hole all the way through member 19, nor does the indention 20 have to rectangular in shape. Any indention capable of engaging any locking hook 12b would suffice. The member 19 of the cover 4b may have a member hole 21. The member hole 21 and the hole 10b are coaxial with one another when the cover 4b is engaged with the locking hook 12b of the security tab 3c as shown in FIG. 4. The member hole 21 and the hole 10b are for accepting a locking member (not shown). The locking member is as described in an embodiment detailed above.

The cover 4b is removed from the chassis 2b by depressing the release surface 15b to deform the appendage 18a and thereby disengage the locking hook 12b from the indention 20. With the locking hook 12b disengaged, the cover 4b may be moved in the first direction 5 and the cover 4b may be removed from the chassis 2b.

DESCRIPTION OF ANOTHER EMBODIMENT OF THE SECURING APPARATUS

Figure 5:
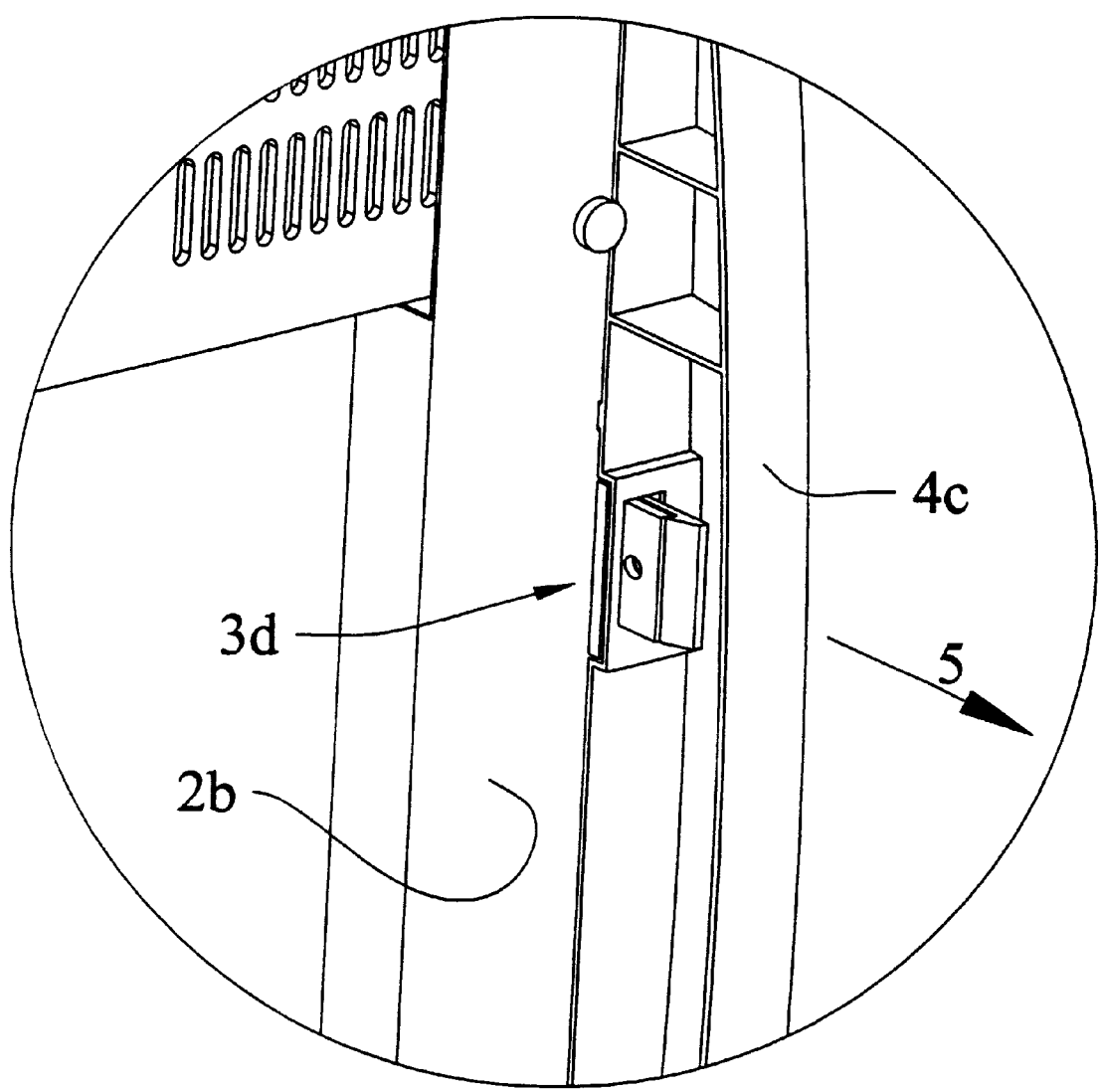
FIG. 5 is an enlarged perspective view of another embodiment of the concealed security tab engaged with a computer system cover.

Another embodiment of the invention is shown in FIG. 5. The chassis 2b is substantially identical to the chassis 2b described in an embodiment immediately above.

Security Tab

Figure 5B:
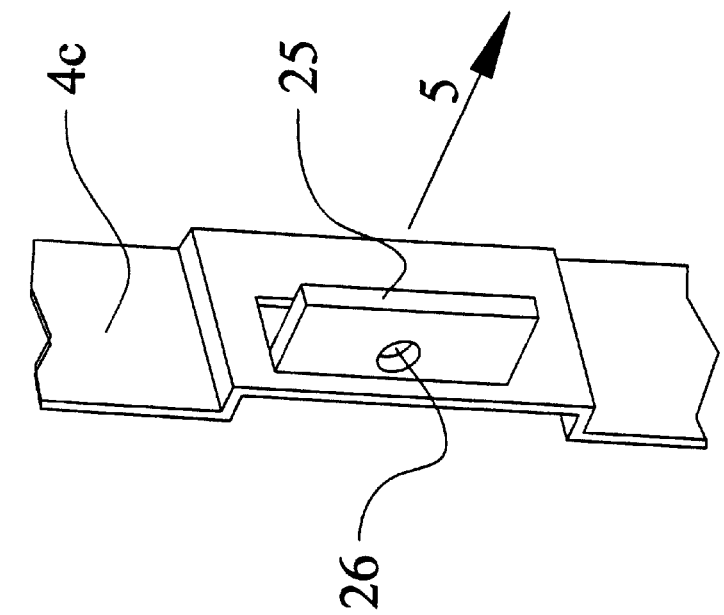
FIG. 5B is a perspective view or a portion of the computer system cover shown in FIG. 5.
Figure 5A:
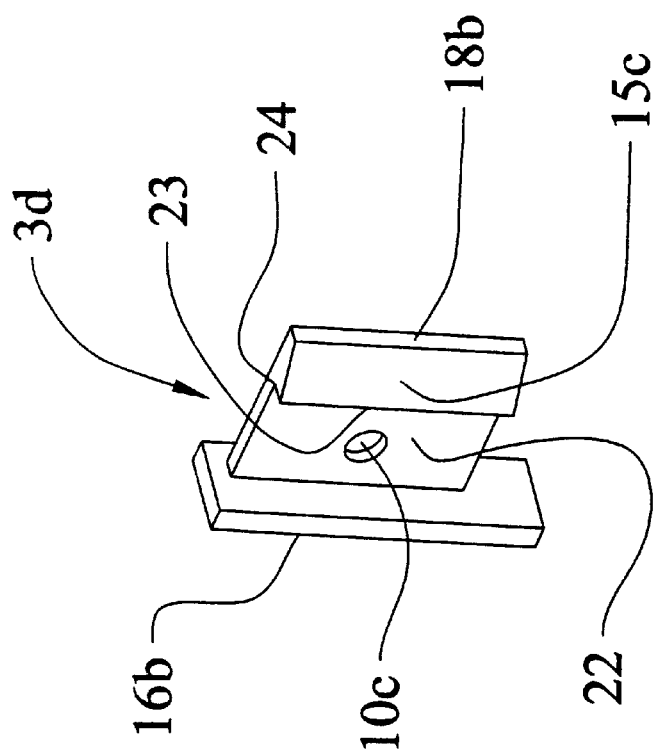
FIG. 5A is a perspective view of the security tab shown in FIG. 5.

The security tab 3d is illustrated in FIGS. 5 and 5A. The security tab 3d has a base 16b. The base 16b may be fastened to the chassis 2b by any conventional means, or the base 16b and the security tab 3d may be formed from the same material as the chassis 2b. As shown in FIG. 5A, an appendage 18b is substantially perpendicular to the base 16b. The appendage 18b may be coupled to the base 16b by any means and may also be manufactured as a unit with the base 16b. The appendage 18b has a first side of contact 22 and a second side of contact 23. The first side of contact 22 and the second side of contact 23 adjoin to form an inside corner 24. The security tab 3d has a release surface 15c near a side of the appendage 18b opposite from the base 16b. The release surface 15c is for pushing and thereby disengaging the security tab 3d from a cover 4c. The security tab 3d may have a hole 10c through the appendage 18b and the first side of contact 22.

Cover

A catch 25 that is substantially parallel with the first side of contact 22 of the appendage 18b is shown in FIGS. 5 and 5B. The catch 25 is engaged in the inside corner 24 when the cover is engaged with the security tab 3d. The catch 25 of the cover 4c may have a catch hole 26. The catch hole 26 and the hole 10c are coaxial with one another when the cover 4c is engaged with the security tab 3d as shown in FIG. 5. The catch hole 26 and the hole 10c are for accepting a locking member (not shown). The locking member is as described in an embodiment detailed above.

The cover 4c is removed from the chassis 2b by depressing the release surface 15c to deform the appendage 18b and thereby disengage the appendage 18b from the catch 25. With the appendage 18b disengaged from the catch 25, the cover 4c may be moved in the first direction 5 and the cover 4c may be removed from the chassis 2b.

It is a feature of each of the embodiments described above that the respective security tabs are located in a location where the security tabs are not visible from the front of the computer.

As shown in FIG. 1, the securing apparatus is a part of a computer system 1. In embodiments of the invention, the securing apparatus is coupled to a power supply 27, a central processing unit (not shown), and a memory module (not shown). The central processing unit and the memory module are well known to those skilled in the art and would be understood to be located within the computer system 1.

Method of Securing a Computer System

An embodiment of the invention is a method of securing a computer system. For either manufacture or use, embodiments of the invention can be employed to secure a computer system. Such a method includes the acts of placing a cover for at least a portion of a computer chassis adjacent to a side of the computer chassis so that an opening in the cover aligns with a security tab. Additionally, the method includes the act of moving the cover toward the security tab so that the security tab enters into the opening to engage the security tab in the opening.

Many other types of locking mechanisms are known in certain other fields or art. However, the present invention is directed specifically toward the securing of computer systems. The scope of the invention is not intended to enter into the other fields that may also employ locking mechanisms.

From the foregoing it will be appreciated that, although specific embodiments of the invention have been described herein for purposes of illustration, various modification may be made without deviating from the spirit and scope of the invention. Accordingly, the invention is not limited except as by the claims.

Advantages of the Invention

Embodiments of the invention provide a unique combination of elements that enable both easy access to the case of a computer system and controlled access to the computer system. Opening of the case of embodiments of the invention can be accomplished without the use of tools such as screwdrivers or wrenches. Efficient attachment for a cable or other locking mechanism is provided as well. The invention is also configured to provide improved concealment of the securing apparatus to block a view of the securing apparatus from a user. Concealment not only improves the aesthetics of the computer system, but also provides an element of surprise to an unsuspecting thief that increases the chances of apprehending the thief.

What is claimed is:

1. A computer system securing apparatus comprising:
   a computer chassis;
   a security tab extending from said computer chassis along a first direction wherein said security tab:
      extends substantially perpendicular from said chassis,
      is formed from a portion of the material of said chassis,
      includes a first edge,
      includes a second edge on the opposite side of said security tab from the first edge, the second edge being is substantially parallel to the first edge,
      includes a radial edge, the radial edge extending between the first edge and the second edge,
      includes a hole for accepting a locking member, and
      includes a locking hook, wherein the locking hook:
         is formed from a portion of the material of said security tab, and
         includes a release surface;
   a cover enclosing a side of said computer chassis, said cover being detachable from said computer chassis by movement in the first direction, said cover having an opening through which said security tab extends;
   wherein the locking hook of said security tab detachably engages said cover; and
   wherein by pushing the release surface in a direction substantially perpendicular to the first direction, the locking hook of said security tab is disengaged from said cover and said cover is permitted to move in the first direction.

2. A computer system securing apparatus comprising:
   a computer chassis;
   a security tab extending from said computer chassis along a first direction; and
   a cover enclosing at least a portion of a side of said computer chassis, said cover being detachable from said computer chassis by movement in the first direction, said cover having an opening through which said security tab extends.

3. The apparatus of claim 2 wherein said security tab extends substantially perpendicular from said chassis in the first direction.

4. The apparatus of claim 2 wherein said security tab is formed from a portion of the material of said chassis.

5. The apparatus of claim 2 wherein said security tab includes:
   a first edge,
   a second edge on the opposite side of said security tab from the first edge, the second edge being substantially parallel with the first edge,
   a radial edge of said security tab, the radial extending between the first edge and the second edge, and
   a hole for accepting a locking member.

6. The securing apparatus of claim 2 wherein said security tab includes a locking hook for detachably engaging said cover.

7. The securing apparatus of claim 2 wherein said security tab includes:
   a base coupled to said chassis,
   a first surface of an appendage that is substantially perpendicular to the base, the appendage being coupled to the base,
   a locking hook extending from the first surface for detachably engaging said cover,
   and a release surface coplanar with the first surface, the release surface for pushing to disengage said security tab from said cover.

8. The securing apparatus of claim 2 wherein said security tab includes: a base coupled to said chassis, an appendage that is substantially perpendicular to the base, the appendage being coupled to the base, the appendage having a first side of contact and a second side of contact, the first side of contact and the second side of contact adjoining together to form an inside corner, and a release surface near a side of the appendage opposite from the base, the release surface for pushing to disengage said security tab from said cover.

9. The securing apparatus of claim 2 wherein said security tab is located in a location not visible from the front of the computer system.

10. The securing apparatus of claim 2 wherein said securing apparatus is coupled to a power supply, a central processing unit, and a memory module.

11. The apparatus of claim 5 wherein said security tab includes a locking hook, the locking hook being formed from a portion of the material of said security tab, and the locking hook includes a release surface for pushing to operate said security tab.

12. The securing apparatus of claim 7 wherein said locking hook includes a release surface for pushing to disengage said security tab from said cover.

13. The securing apparatus of claim 7 wherein the locking hook is a wedge-shaped extension from the first surface.

14. The securing apparatus of claim 7 wherein said cover includes a member that is substantially parallel with the first surface and the member includes an indention for engaging the locking hook.

15. The securing apparatus of claim 8 wherein said cover includes a catch that is substantially parallel with the first side of contact.

16. The securing apparatus of claim 14 wherein the indention for engaging the locking hook is a rectangular opening.

17. The securing apparatus of claim 14 wherein the member and the first surface each have a hole, each hole being coaxial with the other when said cover is engaged with the locking hook of said security tab, the holes for receiving a locking member.

18. The securing apparatus of claim 15 wherein the catch is engaged in the inside corner when said cover is engaged with said security tab.

19. The securing apparatus of claim 15 wherein the catch and the appendage each have a hole, each hole being coaxial with the other when said cover is engaged with the locking hook of said security tab, the holes for receiving a locking member.

20. A computer system securing apparatus comprising:
a computer chassis;
a means for engaging a cover with said computer chassis; and
a means for disengaging the cover from said computer chassis.

21. A method of securing a computer system comprising the acts of:
placing a cover for at least a portion of a computer chassis adjacent to a side of the computer chassis so that an opening in the cover aligns with a security tab; and
moving the cover toward the security tab so that the security tab enters into the opening to engage the security tab in the opening.

* * * * *

UNITED STATES PATENT AND TRADEMARK OFFICE
CERTIFICATE OF CORRECTION

PATENT NO.   : 6,075,693
DATED        : June 13, 2000
INVENTOR(S)  : Michael Leman It is certified that error appears in the above-identified patent and that said Letters Patent is hereby corrected as shown below:

Abstract,
Line 9, delete "place" and insert --placed-- in its place.

Column 2,
Line 14, delete "compute" and insert --computer-- in its place;

Column 4,
Line 29, after "to" insert --be--;

Column 6,
Line 11, delete "is";

Column 7,
Line 26, delete "7" and insert -- 6 -- in its place.

Signed and Sealed this

Fourteenth Day of August, 2001

*Attest:*

*Attesting Officer*

NICHOLAS P. GODICI
*Acting Director of the United States Patent and Trademark Office*